United States Patent [19]

Wai Wong

[11] Patent Number: 5,029,129
[45] Date of Patent: Jul. 2, 1991

[54] HIGH-SPEED BIPOLAR MEMORY SYSTEM

[75] Inventor: Thomas S. Wai Wong, San Jose, Calif.

[73] Assignee: Synergy Semiconductor Corporation, Santa Clara, Calif.

[21] Appl. No.: 469,802

[22] Filed: Jan. 22, 1990

Related U.S. Application Data

[63] Continuation of Ser. No. 142,032, Jan. 11, 1988, abandoned.

[51] Int. Cl.$^5$ ............................................. G11C 11/40
[52] U.S. Cl. ................................... 365/155; 365/179
[58] Field of Search ................ 365/154, 155, 174, 179

[56] References Cited

U.S. PATENT DOCUMENTS 4,580,244  4/1986  Birrittella ........................... 365/154

FOREIGN PATENT DOCUMENTS 0196715  10/1986  European Pat. Off. ............ 365/179
0211395  12/1983  Japan ................................... 365/155

*Primary Examiner*—Joseph A. Popek
*Attorney, Agent, or Firm*—Flehr, Hohbach, Test, Albritton & Herbert

[57] ABSTRACT

A switched load diode cell has been developed wherein first and second multi-emitter NPN transistors are provided having bases cross coupled to the other's collectors in typical latch fashion as shown in FIG. 5. A PN diode is provided having an anode coupled to the select line through a load resistor and a cathode coupled to the collector of each associated multi-emitter transistor. A parasitic lateral PNP transistor associated with the PN diode is provided having an emitter coupled to the select line through the same load resistor and a collector connected to the base of the associated multi-emitter transistor. A relatively low resistance load of about 500Ω is connected between the common node which consists of the emitter of the parasitic lateral PNP transistor and the anode of the PN diode and the select line. In this way, a switched load diode cell is provided. Parasitic PNP beta rolls off heavily with current, and the parasitic PNP transistor is nothing more than a PN diode if the beta of the PNP ($beta_P$) is approximately 0. Therefore, the $beta_P$ is to be very low at high current (sense current), and the beta product ($beta_P \times beta_N$) is to be less than 1. In the standby mode, with only standby current flowing in either emitter, $beta_P \times beta_{NSTBY}$ is much more than 1. Therefore, with low standby current, the cell acts just like a PNP loaded cell. But when the cell is being sensed, the cell effectively becomes a resistor with diode loaded cell. A multi-emitter transistor is therefore provided wherein the emitters can have different betas, the betas being achieved by providing a thicker base width and/or higher doping and thereby a lower beta for the reading emitter, and a thinner base width and/or lower doping, and therefore a higher beta for the standby emitter. The change can be achieved by implanting locally into the region defining the base for the outer or read emitter. Using this high/low beta approach, the implementation of the beta product requirement became much easier.

14 Claims, 4 Drawing Sheets

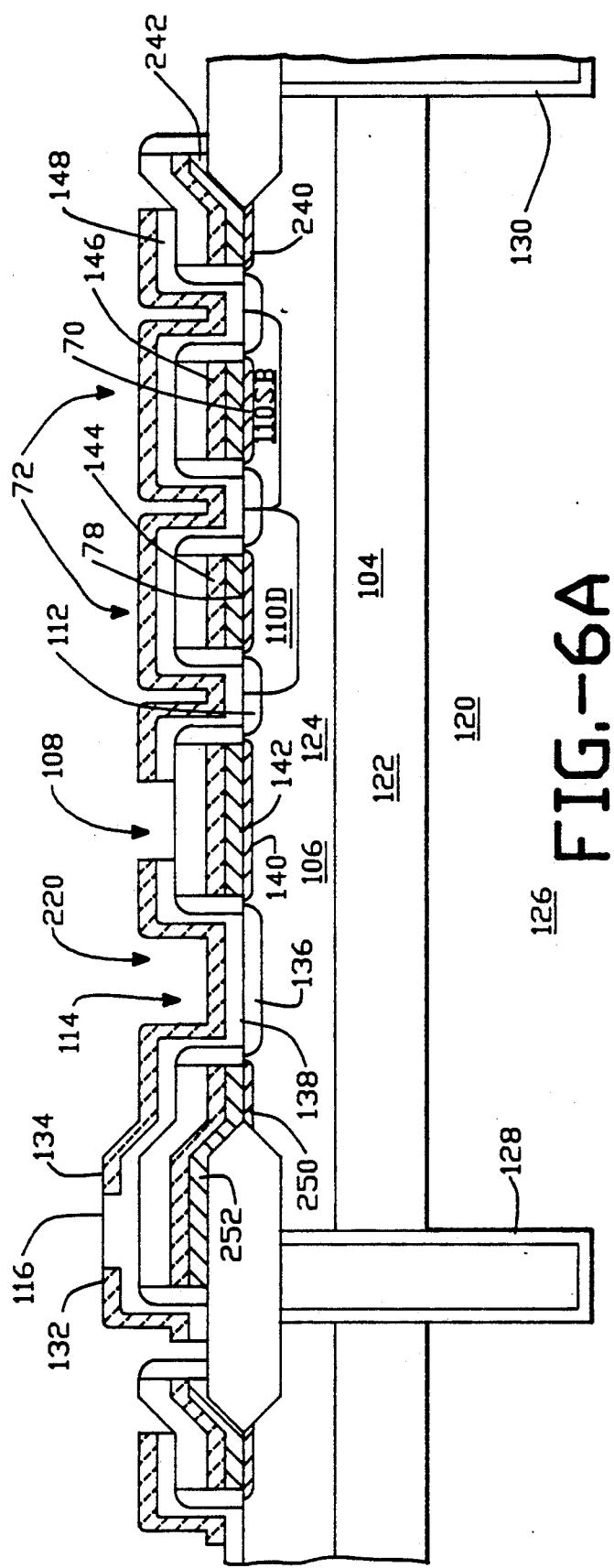
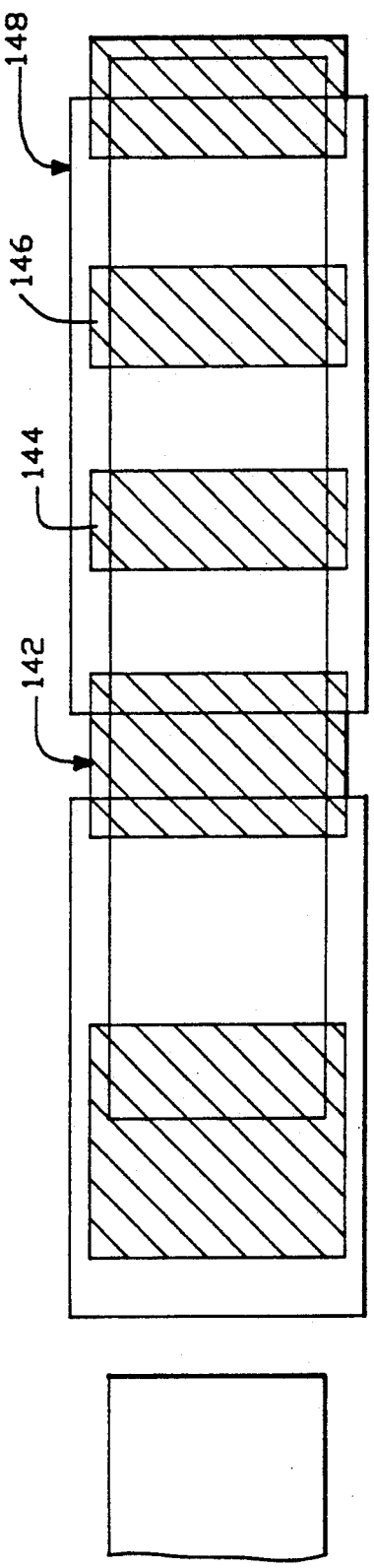
FIG.-6A
FIG.-6B

HIGH-SPEED BIPOLAR MEMORY SYSTEM

This is a continuation of application Ser. No. 142,032 filed Jan. 11, 1988, now abandoned.

FIELD OF THE INVENTION

This invention relates generally to bipolar memory cells, and more particularly to a bipolar memory cell having a switched load for an improved write speed characteristic.

BACKGROUND OF THE INVENTION

Bipolar memory cells are circuits wherein information may be stored in a low current standby mode and may be written into or read from in a higher current mode.

Many current bipolar memory cells comprise a pair of cross coupled multi-emitter transistors operating as a latch such as the transistors 2, 4 shown in FIG. 1. The bases 6, 8 of the transistors are cross coupled to each others' collectors 10, 12. A first emitter 14, 16 of each transistor is coupled to a standby current drain line 17. A second emitter 18 of one transistor is connected to a first bit line 20 and a second emitter 22 of the second transistor 4 is connected to a second bit line 24. The collectors are further coupled to a row select line 26 through load PNP transistors 28 and 30.

The load implements the non-linear resistance required to maintain reasonable cell differential voltage under both low current standby mode and higher current read/write mode. In a previously developed load arrangement discussed in the article, "Technology Improvement for High Speed ECL Rams", IEDM 86, 468-471, by Ogiue, Odaka, Iwabuchi and Uchida, a well known arrangement is described wherein a PNP transistor is utilized as the load. This arrangement, which also appears in FIG. 1, uses first and second PNP transistor 28, 30 having their emitters 32, 34 connected to the select line 26. A collector 36 of the first PNP transistor is connected to the base 6 of the first multi-emitter transistor 2, the base 38 of the second PNP transistor 30, and the collector 10 of the second multi-emitter transistor 4. The second PNP transistor 30 is similarly connected. In this arrangement, either half of the cell operates as an SCR latch or what is commonly called a thyristor latch. It is characterized by the storage of a large amount of charge in the form of diffusion capacitance in the PNP and NPN transistors when the collector base regions of the PNP and NPN transistors are in saturation. This cell device, as with other prior art devices, described briefly below, is characterized by a fundamental charge storage problem in the base region of PNP and collector region of the multi-emitter NPN transistor. The stored charge occurs in the epi region of the cell. The charge storage results in a long write pulse width and long write recovery time for the cell. In order to write opposite data into the cell, the holes that have been injected into the epitaxial (epi) region or collector of the multi-emitter transistor, must be removed from the side of the cell that is being turned off and supplied to the side of the cell that is turning on or being written into.

An alternative approach to this charge storage problem is shown in FIG. 2 wherein the load is provided by Schottky diodes 40, 42, each of the Schottky diodes being connected in series with a 300-500 ohm resistor 44, 46 and in parallel with a 20K 100K ohm resistor 48, 50. In the standby mode, the cell holds latch using the 100K ohm resistor; sensing occurs through the 300 ohm resistor. When a half cell is to be sensed, the 100K ohm resistor is transparent. This cell provides fast write times, but is alpha particle sensitive.

Alpha particle immunity is an absolute requirement in high speed RAMs. Alpha particles may come from almost any material that is used in the fabrication of high speed RAMs. It was once thought that alpha particles came just from the ceramic package used to mount a high speed RAM. Therefore, the solution attempted was a thick coating of polyimide over the die. Later studies proved that alpha particles may occur in the aluminum or other materials used in RAM fabrication. Because the alpha particles occur in the material of which the product is made, the solution must be provided in the design of the part itself. Historically, any part designed to be alpha insensitive is also relatively harder to write. In order to maximize the speed of a RAM, it is necessary to overcome this deficiency. An effort to overcome the alpha particle problem is disclosed at FIG. 3 which is also taken from the Ogiue article. In this design, a large tantalum oxide $Ta_2 O_5$ capacitor 52, 54 is placed in parallel with each of the Schottky diodes. However, this design has the deficiency of requiring a very high standby current and the integration of the capacitors 52, 54.

A more recent effort to overcome this deficiency is shown in U.S. Pat. No. 4,580,244, which discloses the circuit shown in FIG. 4. In this design, the collector base junction of the PNP load transistor 28, 30 is clamped with an NPN transistor 56, 58 operating in the inverse mode. That is, each of the transistors 56, 58 has the base tied to the collector to act as a diode. This NPN transistor (56, 58) functions to steal current from the associated lateral PNP transistor 28, 30, in effect robbing base current and lowering the beta of this transistor. Therefore, less charge is stored and it is easier to write using this design. In other words, the configuration of FIG. 4 is really a beta lowering mechanism which basically gives the PNP emitter lower emission efficiency. However the stored charge problem remains due to the fact that the SCR must hold latch for the cell to work.

Thus, a memory cell is needed that can differentiate so that it is alpha hard with trickle currents into it in the standby mode, but when it is being read using higher sense currents, it is easy to write. When a cell is being written or read, enough current can be used so that the alpha particles do not create a problem.

SUMMARY OF THE INVENTION

Accordingly, it is an object of this invention to provide an improved ECL memory cell.

Another objective herein is to provide a memory cell having a shorter write pulse width.

Yet another objective is to provide a cell wherein the multi-emitter transistor is loaded by the PNP when it is in standby for low alpha sensitivity, and effectively functions in a different configuration when active, so that when the cell is being read it will write easily.

Specifically, it is an objective of this invention to combine the attributes of the PNP and diode loaded cells, and achieve both fast write times and alpha immunity.

In summary, a switched load diode cell has been developed wherein first and second multi-emitter NPN transistors are provided having bases cross coupled to the other's collectors in typical latch fashion as shown in FIG. 5. A PN diode is provided having an anode coupled to the select line through a load resistor and a cathode coupled to the collector of each associated multi-emitter transistor. A parasitic lateral PNP transistor associated with the PN diode is provided having an emitter coupled to the select line through the same load resistor and a collector connected to the base of the associated multi-emitter transistor A relatively low resistance load of about 500Ω is connected between the common node which consists of the emitter of the parasitic lateral PNP transistor and the anode of the PN diode and the select line. In this way, a switched load diode cell is provided. The invention is based partly on the recognition that parasitic PNP beta lo rolls off heavily with current, and the parasitic PNP transistor is nothing more than a PN diode if the beta of the PNP ($beta_P$) is approximately 0 and little to no collector current is flowing. A design objective is to decrease the $beta_P$ to be very low at high current (sense current), and to have a beta product ($beta_P \times beta_N$) less than 1. In the standby mode, with only standby current flowing in the standby emitter of either multi-emitter transistor, $beta_P \times beta_{NSTBY}$ is much more than 1. Therefore, with low standby current, the cell acts just like a PNP loaded cell. But when the cell is being sensed, the cell effectively becomes a resistor with diode loaded cell.

Implementation is based on the knowledge that PNP beta rolls off heavily with current. In addition, when the cell is in standby, the current is drawn through the standby emitter, preferably at about 1 to 10 microamps. When the sense mode is desired, the sense current is received through the other emitter, preferably at 0.5 to 1 milliamp. Recognizing the function of the different emitter, a multi-emitter transistor is provided wherein the emitters can have different betas, the betas being achieved by providing a thicker base width and/or higher doping and thereby a lower beta for the reading emitter, and a thinner base width and/or lower doping, and therefore a higher beta for the standby emitter. The change can be achieved by implanting locally into the region defining the base for the outer or read emitter. Using this high/low beta approach, the implementation of the beta product requirement becomes much easier.

The virtue of this design is that, effectively, it differentiate the cells so that it is alpha hard when sleeping (holding data) while it has a trickle current into it, but when it is being read, it is easy to write. The design effectively forces the PNP and NPN out of saturation when sensing i.e. the epi region of the collector base junction of PNP and NPN will not store charge and will not saturate in the sensing mode. This function is a result of the fact that the beta of the PNP rolls off heavily at high current, and that it is effectively cooperating with two NPN transistors having intrinsically different betas. If enough current flows in the bitline, the beta rolls off to a point where the product of the two betas ($beta_P* beta_N$) is less than one, the PNP and NPN transistors are not in saturation, no stored charge is present, and writing is easily accomplished. The provision of the 500Ω resistor in series with a PNP transistor which is not in saturation creates the functional appearance of a PN diode loaded cell for sensing and writing purposes.

Note that the roll-off in the beta, which is essential to the effective writing operation in combination with the PNP transistor, is achieved by providing the bit line emitter with a thicker base width and/or higher doping than the standby emitter base. The result of having the low beta bit line emitter coupled with a much higher sense/write current is that the product of the PNP beta and NPN beta is less than one during sensing and writing.

The objects, features and advantages of this invention will be better understood from the following description taken in conjunction with the accompanying drawing.

BRIEF DESCRIPTION OF THE DRAWINGS

FIGS. 6A and 6B is a cross section of a portion of a half cell.

DETAILED DESCRIPTION OF THE DRAWINGS

Figure 1:
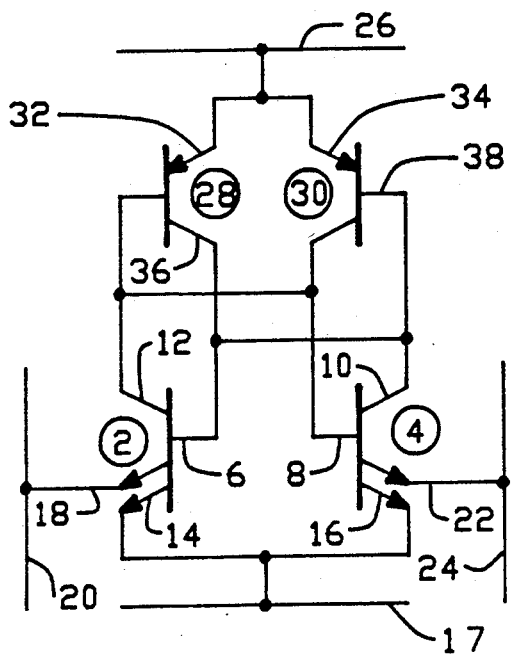
FIGS. 1, 2, 3 and 4 are schematic diagrams of prior art approaches to memory cells.
Figure 2:
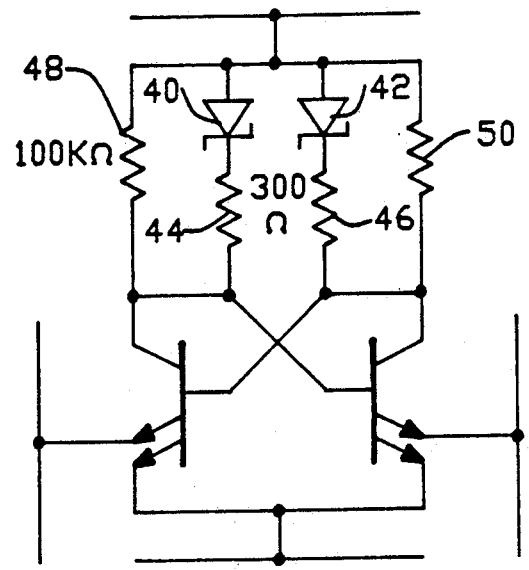
Figure 3:
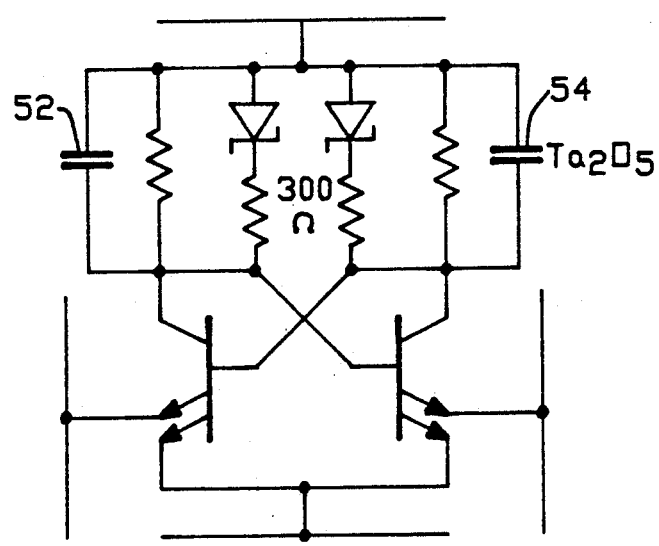
Figure 4:
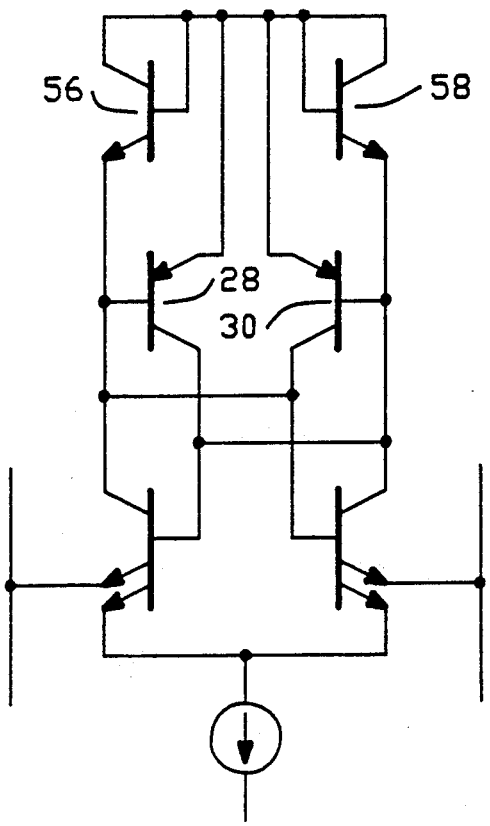
Figure 5:
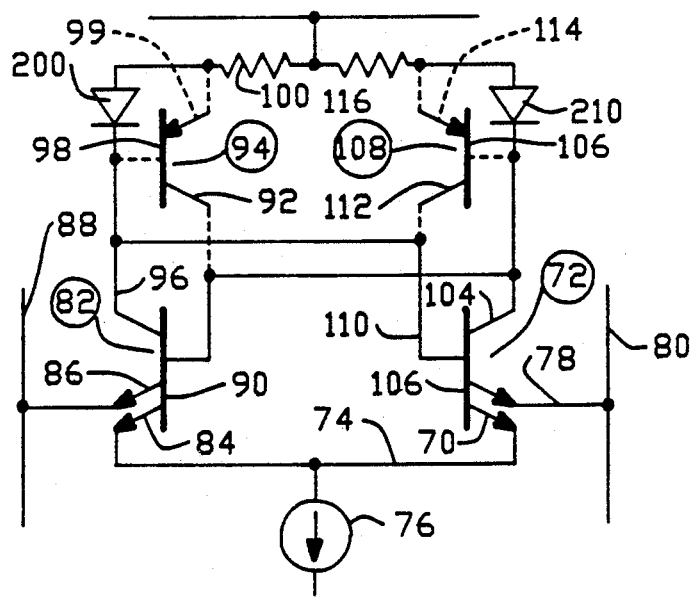
FIG. 5 is a schematic diagram of the preferred embodiment of the present invention.

In FIG. 5, a memory cell in accordance with this invention is shown which is suitable for fabrication in monolithic integrated circuit form. Emitter 70 of the vertical NPN transistor 72 is connected to a standby current drain line 74. A current source 76 is provided connected to this standby current drain line 74 in a manner well known in the art. Read emitter 78 of the multi-emitter transistor 72 is connected to a bit line 80.

The other multi-emitter transistor 82 of the cell also includes first and second emitters 84, 86. The standby emitter 84 is also connected to the standby current drain line 74. The read emitter 86 is connected to a separate bit line 88. The cathode of the PN diode 200 is connected to the collector of NPN transistor 82. The anode of the PN diode 200 is connected through a resistor 100 (preferably of a value of about 500Ω) to a select line 102. The NPN transistor 82 has its base 90 connected to the collector 92 of PNP parasitic transistor 94. The collector 96 of the multi-emitter NPN transistor 82 is connected to the base 98 of PNP parasitic transistor 94, whose emitter 99 is connected to the anode of PN diode 200. The base 90 of the multi-emitter NPN transistor 82, in addition to being connected to the collector of parasitic PNP transistor 94, is also connected to the collector 104 of multi-emitter NPN transistor 72 in the cross coupled design which is well known in the technology. This collector 104 is also connected to the base 106 of a parasitic lateral PNP transistor 108 and a cathode of the PN diode 210. The base 110 of the multi-emitter vertical NPN transistor 72 is connected to the collector 112 of the parasitic PNP transistor 108. The emitter 114 of the parasitic PNP transistor 108 is connected to the anode of PN diode 210 and through load resistor 116 (preferably of a value of about 500 Ω) to select line 102.

As is well known in this technology, when a logical low signal appears on bit line 88 and a logical high signal appears on bit line 80, multi-emitter NPN transistor 82 is ON and NPN transistor 72 of the other half of the cell is OFF due to the respective voltages at their bases. When the low and high signals of bit lines 88 and 80 are removed, the latch state is maintained by the low current from current source 76 through the standby emitter 84 of the NPN transistor which is turned on. When the signals on bit lines 88 and 80 are reversed, that is to high and low respectively, transistor 82 is turned off and transistor 72 is turned on. When the high and low signals are removed, the latch state is now maintained by the low current of current source 76 through the emitter 70 of the switched on transistor 72.

The advantages of this invention are more clearly apparent in FIGS. 6A and 6B, which illustrates how a half cell including the vertical NPN transistor 72, the PN diode 210 with its parasitic lateral PNP transistor 108, and resistor 116 are monolithically integrated into a novel structure to provide faster write pulse width. As shown in FIG. 6A, the integrated structure is fabricated beginning with a P— silicon substrate 120. The N+ buried layer 122 which will function as a buried collector for the vertical devices is formed within the substrate 120, and the N— epitaxial layer 124 is grown over the N+buried layer 122. The resistor 116, lateral PNP 108 and vertical NPN 72 are disposed adjacent one another as shown in the figure.

This portion of the monolithically integrated circuit is electrically isolated from the remaining chip by oxide or trench isolations 128, 130. The various diffusions and implants used to form these devices should be apparent to a person of skill in the art from a study of FIGS. 6A-6B.

Further details of the process may be found i,n a copending application, U.S. Ser. No. 180,626 entitled "Process for Producing a High Performance Bipolar Structure," filed Nov. 11, 1988 in the name of L. Pollack and G. Brown, and assigned to the Assignee of this invention.

Specifically, the resistor 116 is defined by omission of a portion of the silicide layer 132, 134 in the region 116. This resistor 116 is connected through the conductive silicide layer 134 to the anode of PN diode 220 and emitter 114 of the parasitic lateral PNP 108. The P region 136 which defines this parasitic anode and emitter is formed by a boron diffusion out of the P poly layer 138. The base region 106 of the parasitic lateral transistor 108 lies adjacent to the emitter region 136. The N region 140, 240, 250 that provide the PNP base contact is formed by an arsenic diffusion out of the N poly region 142, 242, 252. It can be seen that this base region 106 is common to the collector regions 104 and 124 of the dual emitter vertical NPN transistor 72, providing the necessary connection thereto, appearing in FIG. 5. The collector region 112 and 110 D of the parasitic PNP transistor 108 is formed in the same manner as PNP emitter 136 and is connected to the base region 110 SB and 110 D of the standby 70 and data read 78 emitters of the multi-emitter transistor 72. These base regions (110 SB and 110 D) are both formed by localized implants of P type material, the ion implant dosage and energy being modified to provide the differing beta. It can be seen that the base depth of the data emitter 78 is significantly thicker or deeper than the base associated with the standby emitter 70 to provide the modified beta which is important to the functioning of this device. (Alternatively, this could be achieved by heavier base doping of the base under the data emitter region 78 than the base under the standby emitter 70.) The contacts to the emitter region 70 78 are provided through the N poly layers 144, 146 shown more clearly in FIG. 6B. The necessary contact to the base region of the multi-emitter transistor 72 is provided by the P poly region 148.

As discussed above, the configuration shown in FIGS. 5, 6A and 6B provides the combined attributes of the PNP and diode loaded cell. As is apparent from FIG. 6A, the emitters 70, 78 of the multi-emitter transistor 72 have been given different betas by providing the inner emitter 78 a thicker base 110D than the outboard emitter 70 having the thinner base 110SB. The outboard emitter 70, with its thinner base 110SB, has a higher beta. Given that the two transistors have intrinsically different betas, and the knowledge that the beta of the parasitic PNP transistor 108 and the NPN transistor with emitter 78 will roll off heavily at high current, then by providing enough current in the bit line (preferably a chosen value of 1 milliamp), the beta will roll off in the sense and write mode, and the product of the NPN beta and parasitic PNP beta will be designed to be less than one. Therefore, the parasitic PNP transistor 108 and NPN transistor 72 will come out of saturation and write easily. Due to the presence of the 500Ω resistor 116 in series with the emitter 114 of the parasitic lateral PNP transistor 108, with that transistor out of saturation, a PN diode load in series with the NPN transistor 72 is created, allowing easy writing in this cell.

Figure 7C:
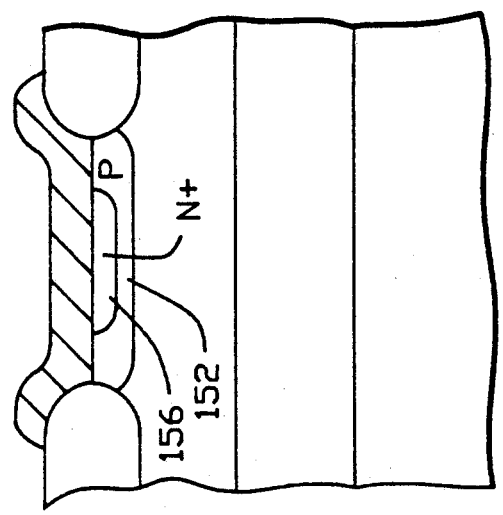
FIGS. 7A, 7B and 7C illustrate exemplary structures for a diode in the cell of FIG. 5.
Figure 7B:
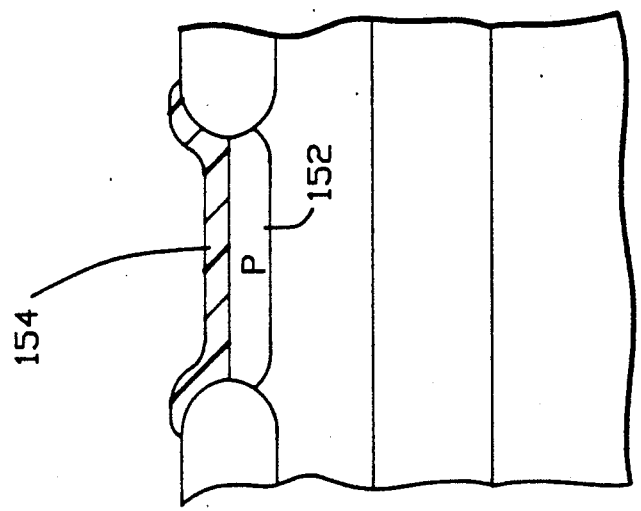
Figure 7A:
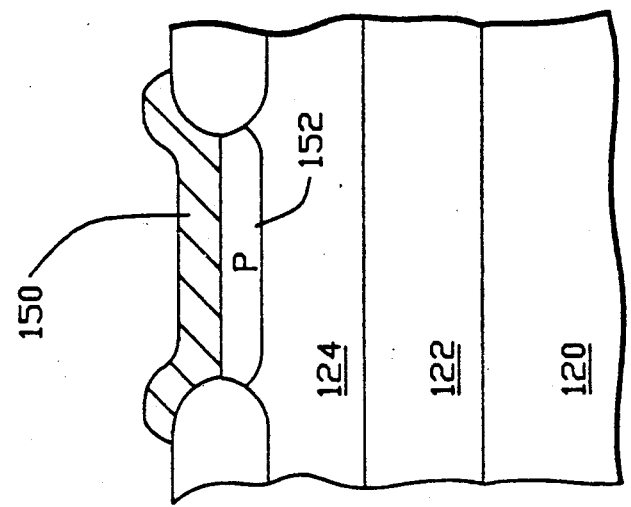

The PN diode schematically indicated at 200, 210 in FIG. 5 can be incorporated in the structure of FIG. 6A using any of the structures shown in FIG. 7. For example, FIG. 7A illustrates a PN diode formed by adding a metal contact 150 over a p-type region 152 formed in N epi layer 124. FIG. 7B illustrates defining the diode using a P+poly region 154 over p-type region 152. FIG. 7C illustrates use of a metal contact 150 over p region 152 and region 156 defined to form an inverted transistor PN diode. Any of these structures would be consistent with the product and process disclosed in FIG. 6A and 6B.

By this discussion, it should be appreciated that there has been provided a bipolar memory cell with an improved write characteristic for faster writing times, faster write recovery times and which is highly alpha particle insensitive. Modifications of the preferred embodiment may become apparent to a person of skill in the art who studies this invention disclosure.

Other improvements of this invention are modifications of the preferred embodiment disclosed herein which will become apparent to persons skilled in the art who study the subject invention disclosure. Therefore, the scope of the invention is to be defined only by the following claims.

What is claimed is:

1. An improved bipolar memory cell having first (82) and second (72) multi-emitter cross-coupled transistors and first means for loading said first multi-emitter transistor having a series combination of a resistor (100) connected to a select line and in series with a first semiconductor device responsive to the state of said first multi-emitter transistor to function as a PN diode (200) or a parasitic PNP transistor (94), the series combination being connected to both a base and a collector of said first multi-emitter transistor and second means for loading said second multi-emitter transistor having a series combination of a resistor connected to said select line and in series with a second semiconductor device responsive to the state of said second multi-emitter transistor to function as a PN diode or a parasitic PNP transistor the series combination being connected to both a base and a collector of said second multi-emitter transistor.

2. The improved bipolar memory cell according to claim 1 wherein said PN diode of each of said first and second means has a cathode connected to said multi-emitter transistor and an anode connected to said select line through said resistor.

3. The improved bipolar memory cell according to claim 2 wherein each of said multi-emitter transistors includes a first emitter connected to a separate bit line and a second emitter connected to a standby current drain line common to the second emitter of both of said multi-emitter transistors, each of said emitters being associated with a different base width and base doping, said first emitter of each said transistor being associated with a thicker base width and high doping, and therefore, a lower beta, 0 said second emitter of each said transistor being associated with a thinner base and lower doping, and therefore a higher beta, whereby the product of the beta of each said bit line emitter transistor and the beta of said parasitic PNP transistor is less than one in sense and write modes and said resistor is effectively in series with said multi-emitter transistor when said bit line is selected.

4. The improved bipolar memory cell according to claim 3 wherein said resistor has a value of about 500Ω.

5. The improved bipolar memory cell according to claim 1 wherein said resistor has a value of about 500Ω.

6. The improved bipolar memory cell according to claim 1 wherein each of said first and second multi-emitter transistors includes first and second emitters, each associated with a different base width and base doping in said transistor, wherein different betas are effectively achieved in each said multi-emitter transistor.

7. The bipolar memory cell according to claim 1 wherein each said PN diode has a cathode coupled to one of said multi-emitter transistors and an anode coupled to said select line through said resistor.

8. The improved bipolar memory cell according to claim 7 wherein each of said first and second multi-emitter transistors includes first and second emitters, each associated with a different base width and base doping in said transistor, wherein different betas are effectively achieved in each said multi-emitter transistor.

9. The improved bipolar memory cell according to claim 8 wherein said resistor has a value of about 500Ω.

10. The improved bipolar memory cell according to claim 8 wherein each of said multi-emitter transistors having said first emitter connected to a separate bit line and said second emitter connected to a standby current drain line common to the second emitter of both of said multi-emitter transistors, said first emitter of each said transistor being associated with a thicker base width and high doping, and therefore, a lower beta, said second emitter of each said transistor being associated with a thinner base and lower doping, and therefore a higher beta, whereby the product of the beta of each said bit line emitter transistor and the beta of said parasitic PNP transistor is less than one in sense and write modes and said resistor is effectively in series with said multi-emitter transistor when said bit line is selected.

11. The improved bipolar memory cell according to claim 7 wherein each of said multi-emitter transistors includes a first emitter connected to a separate bit line and a second emitter connected to a standby current drain line common to the second emitter of both of said multi-emitter transistors, each of said emitters being associated with a different base width and base doping, said first emitter of each said transistor being associated with a thicker base width and high doping, and therefore, a lower beta, said second emitter of each said transistor being associated with a thinner base and lower doping, and therefore a higher beta, whereby the product of the beta of each said bit line emitter transistor and the beta of said parasitic PNP transistor is less than one in sense and write modes and said resistor is effectively in series with said multi-emitter transistor when said bit line is selected.

12. A monolithically integrated memory cell including
a first bit line,
a second bit line,
a select line,
a standby current line,
a first multi-emitter transistor having a base, a collector, a first emitter coupled to said first bit line, and a second emitter coupled to said standby current line,
a second multi-emitter transistor having a base, a collector, a first emitter coupled to said second bit line, and a second emitter coupled to said standby current line, said base being coupled to the collector of said first transistor, said collector being coupled to the base of said first transistor,
wherein each of said first and second multi-emitter transistors includes first and second emitters, each associated with a different base width and base doping in said transistor, wherein different betas are effectively achieved in each said multi-emitter transistor in response to current flow in said transistor,
said first means for loading said first multi-emitter transistor having a series combination of a resistor connected to said select line and in series with a first semiconductor device responsive to the state of said first multi-emitter transistor to function as a PN diode or a parasitic PNP transistor, the series combination being connected to both a base and a collector of said first multi-emitter transistor, and second means for loading said first multi-emitter transistor having a series combination of a resistor connected to said select line and in series with a second semiconductor device responsive to the state of said second multi-emitter transistor to function as a PN diode or a parasitic PNP transistor, the series combination being connected to both a base and a collector of said second multi-emitter transistor,
whereby with a low standby current flow, the cell functions as a PNP transistor loaded cell, and at a higher sense or write current flow than said standby current flow, the cell functions as a PN diode loaded cell.

13. The improved bipolar memory cell according to claim 12 wherein each said PN diode has an anode coupled to one of said multi-emitter transistors and an anode coupled to said select line through said resistor.

14. The improved bipolar memory cell according to claim 13 wherein said resistor has a value of about 500Ω.

* * * * *